(12) United States Patent
Hakuta

(10) Patent No.: US 9,190,574 B2
(45) Date of Patent: Nov. 17, 2015

(54) SEMICONDUCTOR LIGHT EMITTING ELEMENT

(71) Applicant: FUJIFILM Corporation, Tokyo (JP)

(72) Inventor: Shinya Hakuta, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/465,354

(22) Filed: Aug. 21, 2014

(65) Prior Publication Data

US 2014/0361330 A1 Dec. 11, 2014

Related U.S. Application Data

(63) Continuation of application No. PCT/JP2013/000933, filed on Feb. 20, 2013.

(30) Foreign Application Priority Data

Feb. 21, 2012 (JP) .................................. 2012-035076

(51) Int. Cl.
*H01L 33/46* (2010.01)
*H01L 33/60* (2010.01)
*H01L 33/10* (2010.01)
*H01L 33/30* (2010.01)

(52) U.S. Cl.
CPC .............. *H01L 33/46* (2013.01); *H01L 33/10* (2013.01); *H01L 33/60* (2013.01); *H01L 33/30* (2013.01)

(58) Field of Classification Search
CPC ................................. H01L 33/46; H01L 33/60
USPC .......................................................... 257/98
See application file for complete search history.

(56) References Cited

U.S. PATENT DOCUMENTS

| | | | |
|---|---|---|---|
| 5,226,053 A | 7/1993 | Cho et al. | |
| 5,361,273 A | 11/1994 | Kosaka | |
| 2002/0080836 A1* | 6/2002 | Hwang | ............................ 372/45 |
| 2010/0231682 A1 | 9/2010 | Ohno | |
| 2012/0027341 A1 | 2/2012 | Genei et al. | |
| 2012/0114005 A1* | 5/2012 | Inao et al. | ................... 372/50.11 |
| 2013/0058102 A1* | 3/2013 | Lin | .......................... 362/296.04 |

FOREIGN PATENT DOCUMENTS

| | | |
|---|---|---|
| JP | 4-333290 A | 11/1992 |
| JP | 5-275739 A | 10/1993 |
| JP | 6-196681 A | 7/1994 |
| JP | 6-224405 A | 8/1994 |
| JP | 2003-332615 A | 11/2003 |
| JP | 2009-70929 A | 4/2009 |
| JP | 2010-219220 A | 9/2010 |

OTHER PUBLICATIONS

Chang et al. "Design and Fabrication of Temperature-Insensitive InGaP—InGaAlP Resonant-Cavity Light-Emitting Diodes", IEEE Photonics Technology Letters, Aug. 15, 2006, vol. 18, No. 16, pp. 1690-1692.
Japanese Office Action, dated Feb. 3, 2015, in related application No. JP2012-035076.
Extended European Search Report, dated Aug. 25, 2015, for European Application No. 13751123.4.

* cited by examiner

*Primary Examiner* — Christine Enad
(74) *Attorney, Agent, or Firm* — Birch, Stewart, Kolasch & Birch, LLP

(57) ABSTRACT

A semiconductor light emitting element that outputs emitted light having a predetermined emitted light peak wavelength λ includes: at least a substrate; a lower distributed Bragg reflector layer provided on the substrate; and a light emitting layer provided on the lower distributed Bragg reflector layer. At least one phase changing layer having a thickness of mλ/2n (wherein n is the refractive index of the phase changing layer, and m is an integer 1 or greater) is provided within the lower distributed Bragg reflector layer.

10 Claims, 15 Drawing Sheets

FIG.7

| | Material | REFRACTIVE INDEX (@780nm) | thickness(um) | No. |
|---|---|---|---|---|
| | air | | | |
| 18 | SiN | 1.997 | 0.4881 | |
| 17 | contact | 3.693 | 0.025 | |
| | Al331 | 3.428 | 0.4259 | |
| 15 | Al280 | 3.472 | 0.3985 | |
| 20 | active | 3.612 | 0.108 | |
| 13 | Al280 | 3.472 | 0.2847 | |
| | Al900 | 3.087 | 0.0619 | 1 |
| 31 | Al300 | 3.455 | 0.0571 | |
| | Al900 | 3.087 | 0.0619 | 2 |
| | Al300 | 3.455 | 0.0571 | |
| 32 | Al900 | 3.087 | 0.0619 | 3 |
| | Al300 | 3.455 | 0.0571 | |
| | Al900 | 3.087 | 0.0619 | 4 |
| | Al300 | 3.455 | 0.0571 | |
| | Al900 | 3.087 | 0.0619 | 5 |
| | Al300 | 3.455 | 0.0571 | |
| | Al900 | 3.087 | 0.0619 | 6 |
| | Al300 | 3.455 | 0.0571 | |
| | Al900 | 3.087 | 0.0619 | 7 |
| | Al300 | 3.455 | 0.0571 | |
| | Al900 | 3.087 | 0.0619 | 8 |
| | Al300 | 3.455 | 0.0571 | |
| | Al900 | 3.087 | 0.0619 | 9 |
| | Al300 | 3.455 | 0.0571 | |
| 30 | Al900 | 3.087 | 0.0619 | 10 |
| | Al300 | 3.455 | 0.0571 | |
| | Al900 | 3.087 | 0.0619 | 11 |
| | Al300 | 3.455 | 0.0571 | |
| | Al900 | 3.087 | 0.0619 | 12 |
| | Al300 | 3.455 | 0.0571 | |
| | Al900 | 3.087 | 0.0619 | 13 |
| | Al300 | 3.455 | 0.0571 | |
| | Al900 | 3.087 | 0.0619 | 14 |
| | Al300 | 3.455 | 0.0571 | |
| | Al900 | 3.087 | 0.0619 | 15 |
| | Al300 | 3.455 | 0.0571 | |
| | Al900 | 3.087 | 0.0619 | 16 |
| | Al300 | 3.455 | 0.0571 | |
| | Al900 | 3.087 | 0.0619 | 17 |
| | Al300 | 3.455 | 0.0571 | |
| | Al900 | 3.087 | 0.0619 | 18 |
| | Al300 | 3.455 | 0.0571 | |
| | Al900 | 3.087 | 0.0619 | 19 |
| | Al300 | 3.455 | 0.0571 | |
| | Al900 | 3.087 | 0.0619 | 20 |
| 10 | GaAs SUBSTRATE | 3.693 | | |

| Material | REFRACTIVE INDEX (@780nm) | thickness(um) | No. |
|---|---|---|---|
| air | | | |
| SiN | 1.997 | 0.4881 | |
| contact | 3.693 | 0.025 | |
| Al331 | 3.428 | 0.4259 | |
| Al280 | 3.472 | 0.3985 | |
| active | 3.612 | 0.108 | |
| Al280 | 3.472 | 0.2847 | |
| Al900 | 3.087 | t | 1 |
| Al300 | 3.455 | 0.0571 | |
| Al900 | 3.087 | 0.0619 | 2 |
| Al300 | 3.455 | 0.0571 | |
| Al900 | 3.087 | 0.0619 | 3 |
| Al300 | 3.455 | 0.0571 | |
| Al900 | 3.087 | 0.0619 | 4 |
| Al300 | 3.455 | 0.0571 | |
| Al900 | 3.087 | 0.0619 | 5 |
| Al300 | 3.455 | 0.0571 | |
| Al900 | 3.087 | 0.0619 | 6 |
| Al300 | 3.455 | 0.0571 | |
| Al900 | 3.087 | t | 7 |
| Al300 | 3.455 | 0.0571 | |
| Al900 | 3.087 | 0.0619 | 8 |
| Al300 | 3.455 | 0.0571 | |
| Al900 | 3.087 | 0.0619 | 9 |
| Al300 | 3.455 | 0.0571 | |
| Al900 | 3.087 | 0.0619 | 10 |
| Al300 | 3.455 | 0.0571 | |
| Al900 | 3.087 | 0.0619 | 11 |
| Al300 | 3.455 | 0.0571 | |
| Al900 | 3.087 | 0.0619 | 12 |
| Al300 | 3.455 | 0.0571 | |
| Al900 | 3.087 | 0.0619 | 13 |
| Al300 | 3.455 | 0.0571 | |
| Al900 | 3.087 | 0.0619 | 14 |
| Al300 | 3.455 | 0.0571 | |
| Al900 | 3.087 | 0.0619 | 15 |
| Al300 | 3.455 | 0.0571 | |
| Al900 | 3.087 | 0.0619 | 16 |
| Al300 | 3.455 | 0.0571 | |
| Al900 | 3.087 | 0.0619 | 17 |
| Al300 | 3.455 | 0.0571 | |
| Al900 | 3.087 | 0.0619 | 18 |
| Al300 | 3.455 | 0.0571 | |
| Al900 | 3.087 | 0.0619 | 19 |
| Al300 | 3.455 | 0.0571 | |
| Al900 | 3.087 | 0.0619 | 20 |
| GaAs SUBSTRATE | 3.693 | | |

| | Material | REFRACTIVE INDEX (@780nm) | thickness(um) |
|---|---|---|---|
| | air | | |
| 17 | SiN | 1.997 | 0.4881 |
| 16 | contact | 3.693 | 0.0250 |
| 35 | Al300 | 3.455 | 0.0571 |
| | Al900 | 3.087 | 0.0619 |
| | Al300 | 3.455 | 0.0571 |
| | Al900 | 3.087 | 0.0619 |
| | Al300 | 3.455 | 0.0571 |
| | Al900 | 3.087 | 0.0619 |
| | Al300 | 3.455 | 0.0571 |
| | Al900 | 3.087 | 0.0619 |
| | Al300 | 3.455 | 0.0571 |
| | Al900 | 3.087 | 0.0619 |
| 15 | Al280 | 3.472 | 0.3985 |
| 20 | active | 3.612 | 0.1080 |

| Material | REFRACTIVE INDEX (@780nm) | thickness(um) | No. |
|---|---|---|---|
| air | 1.997 | 0.4881 | |
| SiN | 3.693 | 0.025 | |
| contact | 3.428 | 0.4259 | |
| Al331 | 3.472 | 0.3985 | |
| Al280 | 3.612 | 0.108 | |
| active | 3.472 | 0.2847 | |
| Al280 | 3.087 | 0.124 | 1 |
| Al900 | 3.455 | 0.0571 | |
| Al300 | 3.087 | 0.0619 | 2 |
| Al900 | 3.455 | 0.0571 | |
| Al300 | 3.087 | 0.0619 | 3 |
| Al900 | 3.455 | 0.0571 | |
| Al300 | 3.087 | 0.0619 | 4 |
| Al900 | 3.455 | 0.0571 | |
| Al300 | 3.087 | 0.0619 | 5 |
| Al900 | 3.455 | 0.0571 | 6 |
| Al300 | 3.087 | 0.0619 | 7 |
| Al900 | 3.455 | 0.062 | |
| Al300 | 3.087 | 0.01 | |
| Al900 | 3.455 | 0.062 | 8 |
| Al300 | 3.087 | 0.0571 | |
| Al900 | 3.455 | 0.0619 | 9 |
| Al300 | 3.087 | 0.0571 | |
| Al900 | 3.455 | 0.0619 | 10 |
| Al300 | 3.087 | 0.0571 | |

| Material | REFRACTIVE INDEX (@780nm) | thickness(um) | No. |
|---|---|---|---|
| Al900 | 3.087 | 0.0619 | 11 |
| Al300 | 3.455 | 0.0571 | |
| Al900 | 3.087 | 0.0619 | 12 |
| Al300 | 3.455 | 0.0571 | |
| Al900 | 3.087 | 0.0619 | 13 |
| Al300 | 3.455 | 0.0571 | |
| Al900 | 3.087 | 0.0619 | 14 |
| Al300 | 3.455 | 0.0571 | |
| Al900 | 3.087 | 0.0619 | 15 |
| Al300 | 3.455 | 0.0571 | |
| Al900 | 3.087 | 0.0619 | 16 |
| Al300 | 3.455 | 0.0571 | |
| Al900 | 3.087 | 0.0619 | 17 |
| Al300 | 3.455 | 0.0571 | |
| Al900 | 3.087 | 0.0619 | 18 |
| Al300 | 3.455 | 0.0571 | |
| Al900 | 3.087 | 0.0619 | 19 |
| Al300 | 3.455 | 0.0571 | |
| Al900 | 3.087 | 0.0619 | 20 |
| GaAs SUBSTRATE | 3.693 | | |

| | Material | REFRACTIVE INDEX (@780nm) | thickness(um) | No. |
|---|---|---|---|---|
| | air | | | |
| 17 | SiN | 1.997 | 0.4881 | |
| 16 | contact | 3.693 | 0.0250 | |
| | Al331 | 3.428 | 0.4259 | |
| 15 | Al280 | 3.472 | 0.3985 | |
| 20 | active | 3.612 | 0.1080 | |
| 13 | Al280 | 3.472 | 0.2847 | |
| | Al900 | 3.087 | 0.0619 | 1 |
| 33 | Al300 | 3.455 | 0.1160 | |
| | Al900 | 3.087 | 0.0619 | 2 |
| | Al300 | 3.455 | 0.0571 | |
| | Al900 | 3.087 | 0.0619 | 3 |
| | Al300 | 3.455 | 0.0571 | |
| | Al900 | 3.087 | 0.0619 | 4 |
| | Al300 | 3.455 | 0.0571 | |
| | Al900 | 3.087 | 0.0619 | 5 |
| | Al300 | 3.455 | 0.0571 | |
| | Al900 | 3.087 | 0.0619 | 6 |
| | Al300 | 3.455 | 0.0571 | |
| | Al900 | 3.087 | 0.0619 | 7 |
| 33 | Al300 | 3.455 | 0.1160 | |
| | Al900 | 3.087 | 0.0619 | 8 |
| | Al300 | 3.455 | 0.0571 | |
| | Al900 | 3.087 | 0.0619 | 9 |
| | Al300 | 3.455 | 0.0571 | |
| | Al900 | 3.087 | 0.0619 | 10 |
| | Al300 | 3.455 | 0.0571 | |
| | Al900 | 3.087 | 0.0619 | 11 |
| | Al300 | 3.455 | 0.0571 | |
| | Al900 | 3.087 | 0.0619 | 12 |
| | Al300 | 3.455 | 0.0571 | |
| | Al900 | 3.087 | 0.0619 | 13 |
| | Al300 | 3.455 | 0.0571 | |
| | Al900 | 3.087 | 0.0619 | 14 |
| | Al300 | 3.455 | 0.0571 | |
| | Al900 | 3.087 | 0.0619 | 15 |
| | Al300 | 3.455 | 0.0571 | |
| | Al900 | 3.087 | 0.0619 | 16 |
| | Al300 | 3.455 | 0.0571 | |
| | Al900 | 3.087 | 0.0619 | 17 |
| | Al300 | 3.455 | 0.0571 | |
| | Al900 | 3.087 | 0.0619 | 18 |
| | Al300 | 3.455 | 0.0571 | |
| | Al900 | 3.087 | 0.0619 | 19 |
| | Al300 | 3.455 | 0.0571 | |
| | Al900 | 3.087 | 0.0619 | 20 |
| 10 | GaAs SUBSTRATE | 3.693 | | |

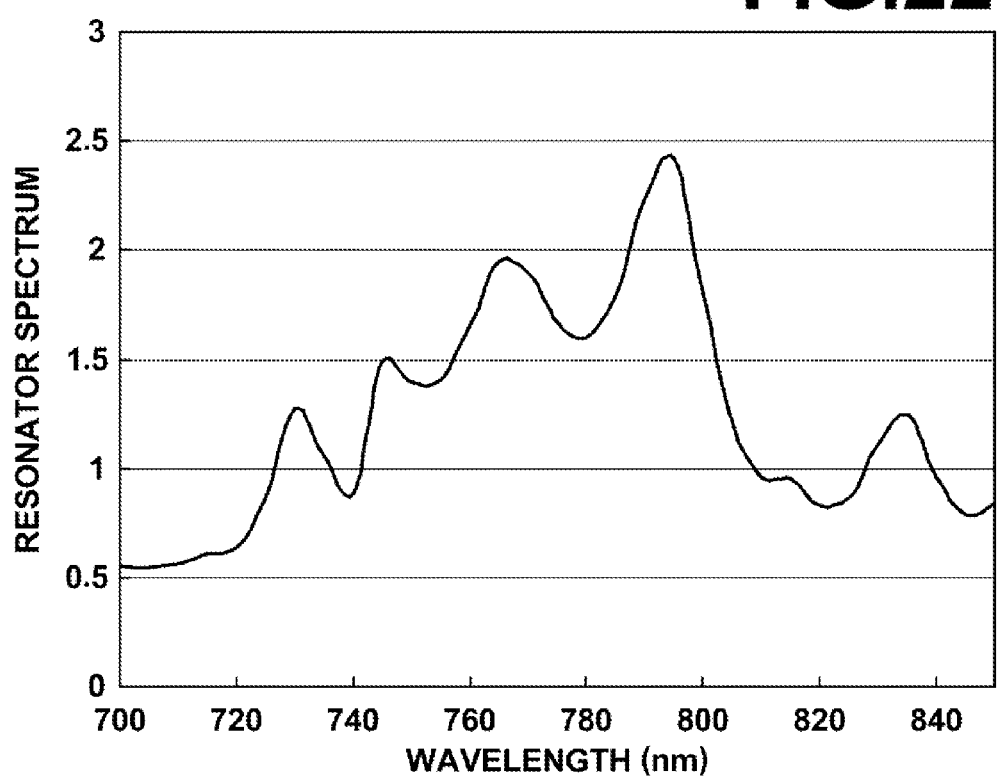

SEMICONDUCTOR LIGHT EMITTING ELEMENT

CROSS REFERENCE TO RELATED APPLICATIONS

The present application is a Continuation of PCT International Application No. PCT/JP2013/000933 filed on Feb. 20, 2013, which claims priority under 35 U.S.C. §119(a) to Japanese Patent Application No. 2012-035076 filed on Feb. 21, 2012. Each of the above applications is hereby expressly incorporated by reference in its entirety, into the present application.

BACKGROUND OF THE INVENTION

1. Technical Field

The present invention is related to a surface emitting type semiconductor light emitting element equipped with a distributed Bragg reflector and an active layer which are sequentially grown on a semiconductor substrate.

2. Background Art

There are semiconductor light emitting elements, such as light emitting diodes (LED's) and semiconductor lasers (LD's: Laser Diodes) which are configured with DBR's (Distributed Bragg Reflectors) in order to improve the light emitting efficiency thereof (Japanese Unexamined Patent Publication No. 6(1994)-196681, Japanese Unexamined Patent Publication No. 2009-070929, etc.). In a semiconductor light emitting element of the surface emitting type, DBR's provided as layers above and below a light emitting layer generally contribute to increases in light emitting efficiency by increasing the reflectance of a specific wavelength as structures that increase resonance. DBR's are constituted by multiple layered films, in which layers having a relatively high refractive index (high refractive index layers) and layers having a relatively low refractive index (low refractive index layers) are alternately laminated. The wavelength which is reflected by a DBR is extremely sensitive to the thicknesses of the films that constitute the DBR. Accordingly, the light emitting efficiency of a semiconductor light emitting element equipped with a DBR depends greatly on the change in emitted light intensity (light emitting efficiency) when the light emitting wavelength shifts. That is, the increase in light emitting efficiency obtained by a DBR and the degree of change in the light emitting efficiency due to shifts in wavelengths are in a trade off relationship.

Meanwhile, it is known that the light emitting spectra of semiconductor light emitting elements change greatly due to changes in ambient temperature, and that the light emission wavelengths shift toward the longer wavelength side as temperatures become higher. For example, a wavelength shift of approximately 10 nm toward the long wavelength side occurs in GaAs—AlAs LED's when the temperature of a utilization environment rises approximately 40° C. For this reason, there is a problem that the light emission intensity of semiconductor light emitting elements equipped with DBR's varies greatly due to changes in ambient temperature.

Japanese Unexamined Patent Publication Nos. 2009-070929 and 2003-332615 propose methods for solving this problem of variation in light emitting efficiency caused by changes in ambient temperature.

Japanese Unexamined Patent Publication No. 2009-070929 discloses an element configuration in which a plurality of multiple layer film reflecting layers that respectively reflect light having longer wavelengths and light having shorter wavelengths than the light spectrum generated by an active layer under the active layer, to effectively cause the light spectrum to become a wide band light spectrum, thereby reducing the influence of wavelength shift caused by changes in ambient temperature.

Japanese Unexamined Patent Publication No. 2003-332615 discloses an element configuration in which a notch filter constituted by a first multiple layer film layer, a second multiple layer film layer, and a spacer layer provided between these two layers is provided, to reduce the influence of wavelength shift caused by changes in ambient temperature.

Meanwhile, exposure devices, in which multiple semiconductor light emitting elements are arranged one dimensionally or two dimensionally, are employed as exposure heads for printers and scanners. Uniformity of light intensity among the arranged plurality of semiconductor light emitting elements is required in such arrayed exposure devices. Here, the expression "light intensity" refers to the intensity of light which is integrated across the light emitting wavelength band of the light emitting elements.

The light intensities emitted by individual semiconductor light emitting elements among a plurality of light emitting elements which are employed in an exposure device also change due to wavelength shifts caused by changes in ambient temperature. Further, a phenomenon that the manner in which the light intensity changes is different for each element has been observed. For this reason, there is a problem that uniformity of light intensities cannot be maintained among a plurality of semiconductor light emitting elements which are employed in an exposure device.

Japanese Unexamined Patent Publication No. 2010-219220 proposes a light emitting device that suppresses changes in light intensity of light emitting elements due to temperature changes, by providing a reflecting layer beneath an active layer, and a surface having recesses and protrusions at a plurality of distances from the reflecting layer above the active layer.

DISCLOSURE OF THE INVENTION

Generally, semiconductor light emitting elements are produced by dividing a wafer, on which various layers are laminated, into a great number of chips, and a great number of semiconductor light emitting elements are produced from a single wafer. Ideally, the film thicknesses of the layered films formed on the wafer are uniform on the surface of the wafer according to design values. In actuality, however, it is difficult to form films uniformly, and fluctuations are generated in the film thicknesses. As a result, portions at which film thicknesses are smaller and greater than design values are generated on a single wafer, and fluctuations in film thicknesses will be present among chips when the wafer is divided into a great number of chips. Basically, reflected wavelengths shift toward the shorter wavelength side as the film thickness of a DBR shifts toward the thinner direction. Fluctuations in wavelengths reflected by the DBR due to the fluctuations in film thicknesses cause differences in emitted light intensity with respect to emitted wavelengths. In addition, it is considered that the fluctuations in film thicknesses also cause the phenomenon that the changes in light intensity due to changes in ambient temperatures differ among chips.

The present invention has been developed in view of the foregoing circumstances. It is an object of the present invention to provide a semiconductor light emitting element, in which the light intensity enhancing effect of a DBR is maintained, while fluctuations in light intensity variations in a great number of elements, which are produced from a single wafer, that accompany temperature changes are suppressed.

A semiconductor light emitting element of the present invention outputs emitted light having a predetermined emitted light peak wavelength λ, and comprises at least:

a substrate;

a lower distributed Bragg reflector layer provided on the substrate; and a light emitting layer provided on the lower distributed Bragg reflector layer;

at least one phase changing layer having a thickness of mλ/2n (wherein n is the refractive index of the phase changing layer, and m is an integer 1 or greater) being provided within the lower distributed Bragg reflector layer.

Here, the phase changing layer having a thickness of mλ/2n is a continuous portion having a single refractive index. However, a layer having a different refractive index may be included therein, if the thickness thereof is approximately 15 nm or less.

Note that the definition of the thickness mλ/2n includes thicknesses within a range of ±10% thereof. That is, the thickness of the phase changing layer may be within a range from (mλ/2n)·0.9 to (mλ/2n)·1.1.

Particularly, it is preferable for two phase changing layers to be provided within the lower distributed Bragg reflector layer.

It is preferable for the lower distributed Bragg reflector layer to be basically constituted by two or more pairs of a low refractive index layer having a thickness a and a high refractive index layer having a thickness b which are alternately laminated; and for one of the low refractive index layers and the high refractive index layers constituting the phase changing layer to have the thickness mλ/2n.

It is preferable for the semiconductor light emitting element of the present invention to be of a configuration, wherein: a distributed Bragg reflector layer is not provided as a layer above the light emitting layer; and an antireflection layer is provided as a layer above the light emitting layer.

In the case that the semiconductor light emitting element of the present invention is of a configuration, wherein: a distributed Bragg reflector layer is not provided as a layer above the light emitting layer; and the antireflection layer is provided as a layer above the light emitting layer, it is preferable for two of the phase changing layers to be provided within the lower distributed Bragg reflector layer; for one of the two phase changing layers to be one of the low refractive index layer and the high refractive index layer that constitutes the pair most toward the side of the light emitting layer; and for the other of the two phase changing layers to be present within one of a range from 0.24 to 0.46 and a range from 0.66 to 0.82, when the lower distributed Bragg reflector layer is divided into percentages, with the side thereof toward the light emitting layer designated as 0, and the side thereof toward the substrate designated as 1. It is particularly preferable for the other of the two layers to be present within a range from 0.27 to 0.39 within the lower distributed Bragg reflector layer.

Alternatively, the semiconductor light emitting element of the present invention may further comprise an upper distributed Bragg reflector layer provided as a layer above the light emitting layer.

In the case that the semiconductor light emitting element further comprises the upper distributed Bragg reflector layer provided as a layer above the light emitting layer, it is preferable for two of the phase changing layers to be provided within the lower distributed Bragg reflecting layer; for one of the two phase changing layers to be one of the low refractive index layer and the high refractive index layer that constitutes the pair most toward the side of the light emitting layer; and for the other of the two phase changing layers to be present within one of a range from 0.22 to 0.33, when the lower distributed Bragg reflecting layer is divided into percentages, with the side thereof toward the light emitting layer designated as 0, and the side thereof toward the substrate designated as 1.

The semiconductor light emitting element of the present invention can be favorably employed as a light emitting diode of the surface emitting type.

The semiconductor light emitting element of the present invention outputs emitted light having the predetermined emitted light peak wavelength λ, and comprises at least: the substrate; the lower distributed Bragg reflector layer provided on the substrate; and the light emitting layer provided on the lower distributed Bragg reflector layer; at least one phase changing layer having a thickness of mλ/2n being provided within the lower distributed Bragg reflector layer. Thereby, the reflective bandwidth of the lower distributed Bragg reflector layer can be widened. Therefore, changes in light intensity caused by changes in ambient temperature can be suppressed.

Accordingly, the light intensity enhancing effect of the DBR is maintained, while fluctuations in film thicknesses when films are formed and changes in light intensity with respect to spectrum shifts due to changes in ambient temperature are suppressed, and light intensity variations in a great number of elements, which are produced from a single wafer, can be suppressed.

BRIEF DESCRIPTION OF THE DRAWINGS

FIG. 7 is a diagram that illustrates the layer structure of an LED according to Simulation 1.

FIG. 15 is a diagram that illustrates the layer structure of an LED according to Simulation 5.

FIG. 19 is a diagram that illustrates the layer structure of an LED according to Example 2.

FIG. 22 is a graph that illustrates the resonator spectrum of an LED of Comparative Example 2.

BEST MODE FOR CARRYING OUT THE INVENTION

Hereinafter, an embodiment of the present invention will be described with reference to the attached drawings.

Figure 1:
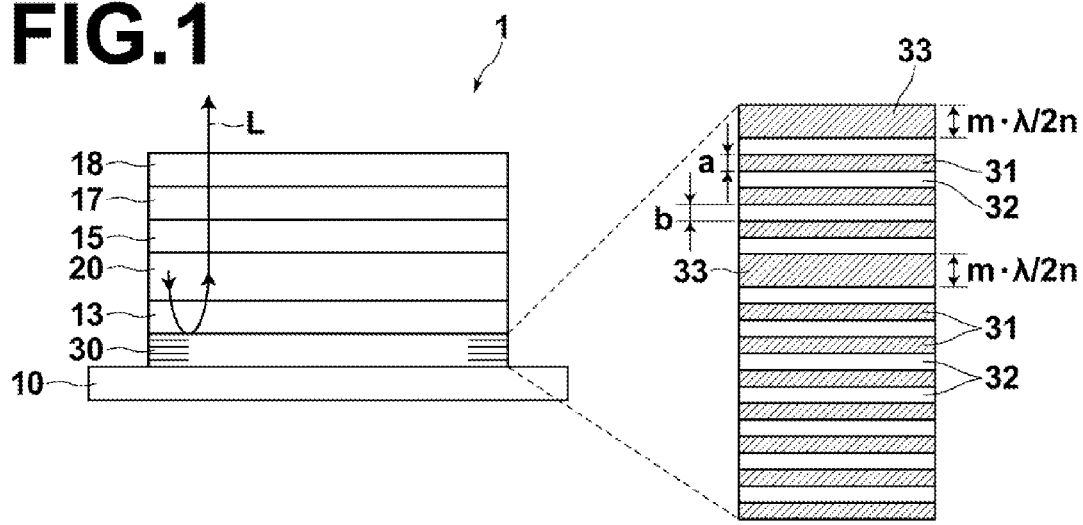
FIG. 1 is a schematic sectional view that illustrates a semiconductor light emitting element 1 according to an embodiment.

FIG. 1 is a schematic sectional view and a partial magnified view that illustrate a semiconductor light emitting element 1 according to an embodiment of the present invention.

The present semiconductor light emitting element 1 is a semiconductor light emitting element of the surface emitting type, equipped with: a p type substrate 10, a lower distributed Bragg reflector layer 30 (hereinafter, referred to as "lower DBR layer 30"), a p type doped layer 13, a light emitting layer 20, an n type doped layer 15, a contact layer 17, and an antireflection layer 18. As illustrated by the arrow that schematically indicates the path of emitted light, light which is generated in the light emitting layer 20 is reflected by the lower DBR layer 30, passes through the antireflection layer 18, and is emitted from the surface of the element.

The composition of each of the layers is not particularly limited. For example, p type GaAs may be employed as the substrate 10, an AlGaAs type multiple layer semiconductor film may be employed as the lower DBR layer 30, p type AlGaAs may be employed as the p type doped layer 13, AlGaAs may be employed as the light emitting layer 20, n type AlGaAs may be employed as the n type doped layer 15, n type GaAs may be employed as the contact layer 17, and $SiO_x$ or $SiN_x$ may be employed as the antireflection layer 18. Note that AlGaAs semiconductor layers may be each of the functional layers by varying the compositional ratios between Al and Ga. Note that the antireflection layer may be formed by a single layer or formed by a plurality of layers. In the case that the antireflection layer is constituted by a single layer and the wavelength of light for which reflection is to be suppressed is $\lambda$, the refractive index n of the antireflection layer is $\lambda(2L-1)/4n$ (here, L is an integer 1 or greater).

As illustrated in the partial magnified view of FIG. 1, the lower DER layer 30 is a multiple layer film constituted by pairs of a low refractive index layer 31 having a relatively low refractive index and a high refractive index layer 32 having a relatively high refractive index, which are alternately laminated. The basic structure of a common DBR layer is a multiple layer film structure in which two or more pairs (a total of four or more layers) of the low refractive index layer 31 having a thickness a and the high refractive index layer 32 having a thickness b are alternately laminated, such that light within a light emitting wavelength band is efficiently reflected. The thicknesses a and b of the low refractive index layers 31 and the high refractive index layers 32 are commonly close to $\lambda/4n$ (here, $\lambda$ is a desired central reflected wavelength, and n is the refractive index of each of the layers).

The present embodiment is characterized by the lower DBR layer 30 having phase changing layers 33 having a thickness of $m\lambda/2n$ therein. $\lambda$ is the peak wavelength of emitted light, n is the refractive index of the phase changing layer with respect to the emitted peak wavelength, and m is an integer one or greater. In the present embodiment, the phase changing layers 33 are constituted by a low refractive index layer composition.

Note that in the film forming step for each layer when producing a semiconductor light emitting element, errors of approximately ±10% at most from design values of film thicknesses may occur. Accordingly, the film thicknesses in the present specification have allowable error ranges of ±10% in thickness.

In addition, in the case that semiconductor light emitting elements are designed to improve light intensity, an upper DBR layer is commonly provided as a layer above a light emitting layer in addition to a lower DBR layer, to adopt a structure in which resonance occurs between the upper and lower DBR layers. However, the semiconductor light emitting element of the present embodiment is of a configuration in which an upper DBR layer is not provided.

The element having the configuration described above is generally produced by sequentially forming each layer on a wafer by a film forming method such as the MOCVD method, and then dividing the wafer into chips. When forming films on the wafer, it is ideal for each semiconductor film to be formed at a uniform film thickness. However, in actuality, fluctuations in thickness occur on the wafer, as described previously. The fluctuations in thickness vary depending on the type of material and the film forming method, but fluctuations of approximately ±10% may occur. DBR's are extremely sensitive to film thickness. Therefore, the fluctuations in film thicknesses on the wafer become factors that cause fluctuations in the temperature properties of each element which is formed by dividing the wafer into chips. However, elements having the configuration of the present embodiment can maintain the light intensity enhancing effects of the DBR, while greatly suppressing fluctuations in the temperature properties among a plurality of elements obtained from a single wafer.

In the above embodiment, two phase changing layers 33 having a thickness of $m\lambda/2$ are provided within the lower DBR layer 30. However, the advantageous effect of suppressing fluctuations in temperature properties can be obtained even if only a single phase changing layer is provided (refer to Simulation 1 to be described later), compared to a case in which a DBR layer is not provided with the phase changing layer.

The reflective bandwidth of the lower DBR layer can be widened by providing the phase changing layers 33. It is considered that as a result, the light intensity enhancing effects of the DBR can be maintained, while suppressing fluctuations in light intensities due to temperature changes.

However, the advantageous effect of suppressing fluctuations in temperature properties becomes more prominent if two phase changing layers 33 are provided within the lower DBR layer 30, and therefore is more preferable.

Figure 2:
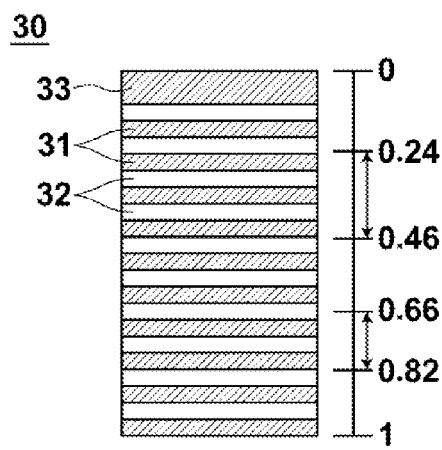
FIG. 2 is a schematic sectional view for explaining phase converting layer insertion positions within a lower DBR layer of the semiconductor light emitting element according to the embodiment.

In the case that two phase changing layers are provided in the lower DBR layer 30, it is preferable for the first phase changing layer 33 to be provided within the pair closest to the light emitting layer 20, as illustrated in the schematic sectional view of the lower DBR layer 30 of FIG. 2. The advantageous effect of suppressing fluctuations in temperature properties can be more prominently obtained by positioning the second phase changing layer 33 within a range from 0.24 to 0.46 or a range from 0.66 to 0.82 and particularly within a range from 0.27 to 0.39, when the thickness of the lower DBR layer is divided into percentages, with the side thereof toward the light emitting layer designated as 0, and the side thereof toward the substrate designated as 1, as illustrated in FIG. 2 (refer to Simulation 2 to be described later). Note that the thickness of a layer which even partially overlaps these ranges may be set to $m\lambda/2$.

Figure 3:
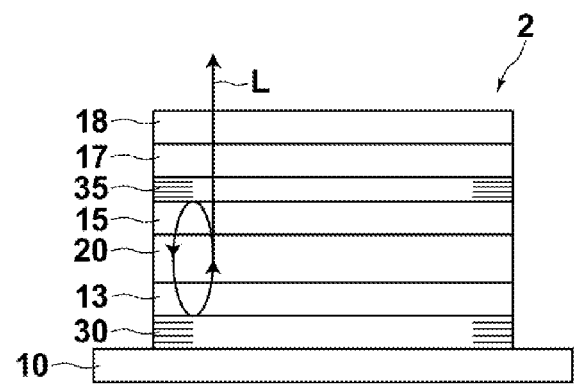
FIG. 3 is a schematic sectional view that illustrates a semiconductor light emitting element 2 according to an example of a design modification.

FIG. 3 is a schematic sectional view that illustrates a semiconductor light emitting element 2 according to an example of a design modification. Here, an upper DBR layer 35 is provided above a light emitting layer 20. The configuration of a lower DBR layer 30 is substantially the same as that described above, and the same advantageous effects of obtaining the light intensity enhancing effect while suppressing fluctuations in temperature properties can be obtained.

Figure 4:
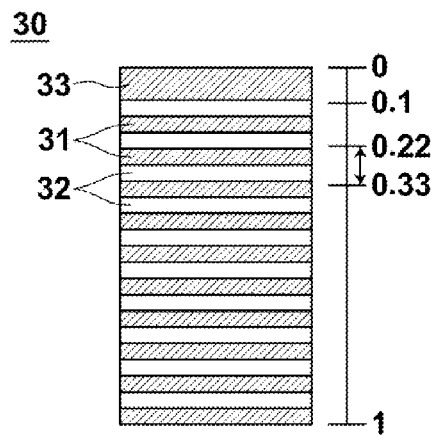
FIG. 4 is a schematic sectional view for explaining phase converting layer insertion positions within a lower DBR layer of the semiconductor light emitting element according to the example of the design modification.

However, in the present configuration, the preferred ranges of positions at which two phase changing layers are provided in the lower DBR layer 30 differ from the embodiment described above. It is preferable for a first phase changing layer 33 to be provided within the pair closest to the light emitting layer 20, as illustrated in the schematic sectional view of the lower DBR layer 30 of FIG. 4. Meanwhile, it is preferable for a second phase changing layer 33 to be positioned within a range from 0.22 to 0.33, when the thickness of the lower DBR layer is divided into percentages, with the side thereof toward the light emitting layer designated as 0, and the side thereof toward the substrate designated as 1, as illustrated in FIG. 4 (refer to Simulation 4 to be described later).

It is preferable for the DBR layer and the light emitting layer to be of the same compositional type, in order to prevent complexities during production. The phase changing layers may be of a composition completely different from the basic layers that constitute the DBR layer. However, it is preferable for the composition of the high refractive index layers or the composition of the low refractive index layers that constitute the basic DBR layer to be employed as the composition of the phase changing layer, from the viewpoint of simplification of production steps. Note that in the embodiment described above, the thicknesses of the low refractive index layers were changed, but the same advantageous effects can be obtained by changing the thicknesses of the high refractive index layers.

In addition, in the case that a plurality of the phase changing layers are provided, film formation conditions must be calculated for each composition and film thickness in order to form the phase changing layers of different compositions and/or film thicknesses in actual production. Therefore, this will lead to an increase in development costs. Accordingly, in the case that a plurality of the phase changing layers are formed, they are constituted by layers having the same composition. In addition, the optimal thickness of the phase changing layers is $\lambda/2n$ (refer to Simulation 3 to be described later), and therefore it is preferable for the thicknesses of the phase changing layers to be the same ($\lambda/2n$).

Note that the phase changing layers having thicknesses of $m\lambda/2n$ described in the above embodiment may have an extremely thin layer having a thickness of up to approximately 15 nm inserted within the interiors thereof (refer to simulation 5 to be described later). As long as the thickness of the inserted layer is up to approximately 15 nm, the advantageous effect of suppressing fluctuations in temperature properties can be sufficiently obtained, without losing the function of the phase changing layer.

Hereinafter, Simulations, Examples, and Comparative Examples that led to the discovery of the preferred configurations of the present invention that achieve the advantageous effects of maintaining the light intensity enhancing effect of the DBR while suppressing temperature induced changes in light intensity (temperature properties) caused by changes in ambient temperature and fluctuations in film thicknesses during production will be described.

<Simulation Method>

First, the simulation method will be described.

Figure 5:
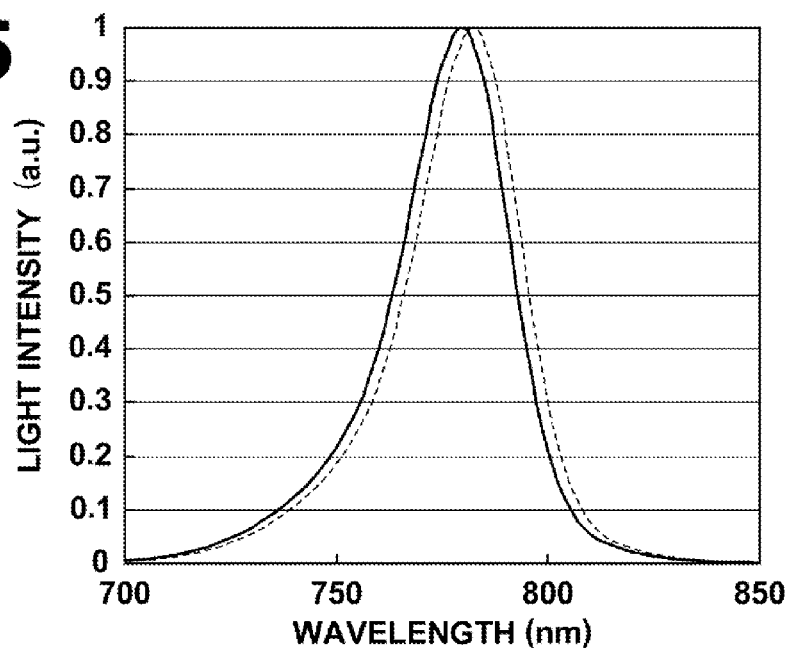
FIG. 5 is a diagram that illustrates the spectrum of natural emitted light.

A GaAs—AlAs type light emitting element that has a peak wavelength of emitted light of 780 nm at room temperature was considered. The natural light emitting spectrum of a GaAs—AlAs type light emitting element which was employed is illustrated in FIG. 5. The natural light emitting spectrum shifts 10 nm toward the long wavelength side (indicated by the broken line in FIG. 5) when the temperature rises approximately 40° C. from room temperature. The natural light emitting spectrum is the spectrum of light emitted by a light emitting layer, and is a spectrum which is not influenced by a DBR.

During actual film formation, shifts in thickness vary depending on the type of material and the film forming method, but shifts in thickness of at most approximately ±10% may occur. Meanwhile, by adjusting film forming conditions and target materials, the shifts in thickness can be suppressed to approximately ±2.5%. Therefore, the following simulations presume that the shifts in thickness are ±2.50.

Figure 6:
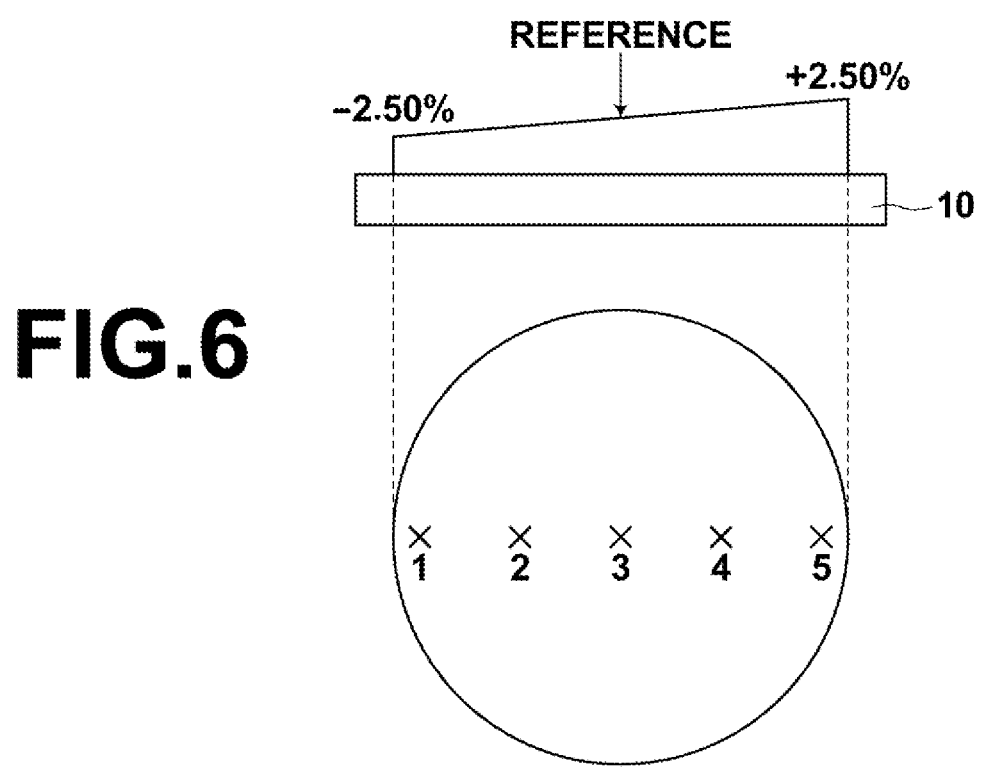
FIG. 6 is a schematic sectional diagram and a schematic plan view that illustrate fluctuations in film thicknesses in the case that films are formed on a wafer.

As illustrated in the schematic sectional diagram of FIG. 6, five elements formed on a single wafer having film thicknesses that differ within a range of ±2.5% are presumed, of which fluctuations in temperature properties and average light magnifications are derived by simulations. The LED structures were evaluated based on the simulated values of the fluctuations in temperature properties and the average light magnifications. An element 1 having a thickness 2.50% thinner than a reference thickness, an element 2 having a thickness 1.25% thinner than the reference thickness, an element 3 having the reference thickness, an element 4 having a thickness 1.25% thicker than the reference thickness, and an element 5 having a thickness 2.50% thicker than the reference thickness at positions corresponding to positions 1 through 5, which are schematically illustrated in the plan view of FIG. 6, are presumed as the five elements having different film thicknesses.

The fluctuations in temperature properties were derived in the following manner.

First, a resonator spectrum $Ri(\lambda)$ is obtained for each element structure (i represents element numbers, i=1, 2, 3, 4, and 5. The same applies in the descriptions to follow).

The resonator spectrum is the spectrum of light which is output from each element in the case that light having the same intensity for all wavelengths is emitted from a light emitting layer, and is determined unrelated to the light emitting spectrum of the light emitting layer. Here, the resonator spectra are derived by simulations that employ inner light emission calculation of multiple layer films that exhibit absorption. Specifically, multiple film layer calculation of externally incident light was performed with reference to *Basic Theory of Optical Thin Films* (by Mitsunobu Kohiyama, The Optronics Co., Ltd.), and phase differences within the light emitting layers were calculated separately to calculate internal light emission. Note that similar calculations can be reproduced by internal light emission calculating software such as SETFOS by FLUXiM AG.

Next, the resonator spectra $Ri(\lambda)$ were multiplied by the natural light emitting spectra $S(\lambda)$ then integrated with respect to wavelengths, to obtain light intensities Pi (i=1, 2, 3, 4, 5) for each element.

$$Pi \propto \int (S(\lambda) \cdot Ri(\lambda)) d\lambda$$

When the ambient temperature increases by 40° C., the natural light emitting spectrum at room temperature shifts 10 nm toward the long wavelength side, and light intensities Pi' are derived for each element employing spectra $S'(\lambda)$ which are shifted 10 nm toward the long wavelength side.

$$S'(\lambda)=S(\lambda-10 \text{ nm})$$

$$Pi' \propto \int (S'(\lambda) \cdot Ri(\lambda)) d\lambda$$

Next, the difference between Pi and Pi' are calculated, to derive the amounts of change in light intensity with respect to temperature. Here, the amounts of change correspond to a difference of 40° C. in ambient temperature. Therefore, amounts of change per 1° C. are calculated from these amounts.

$$dPi/dT=(Pi'-Pi)/40$$

The amounts of change in light intensity dPi/dT (i=1, 2, 3, 4, 5) per unit temperature are calculated for the five elements 1 through 5 in the manner described above, and the maximum values (Max(dPi/dT)) and the minimum values (Min(dPi/dT)) thereof are extracted. The differences between the maximum values and the minimum values are designated as the fluctuations $\delta$ in temperature properties (temperature property fluctuations).

$$\delta = \text{Max}(dPi/dT) - \text{Min}(dPi/dT)$$

The average light emitting magnification by the DBR layer was derived in the following manner.

A light emitting intensity $P_0$ of an LED which is not provided with a DBR layer was obtained, light emitting magnifications $Pi/P_0$ were calculated for the five elements 1 through 5, and the average value of the light emitting magnifications of the five elements is designated as the average light emitting magnification M. Note that in the following description, the average light emitting magnification is also simply referred to as "light emitting magnification".

$$P_0 \propto \int (S(\lambda)) d\lambda$$

$$Pi/P_0 = \int (S(\lambda) \cdot Ri(\lambda)) d\lambda / \int (S(\lambda)) d\lambda$$

$$M = [\Sigma Pi/P_0]/5$$

In the following simulations, elements that employ GaAs substrates and are provided with lower DER layers and AlGaAs type light emitting layers are presumed. The DBR layers are multiple layer films in which $Al_{0.3}Ga_{0.7}As$, which has a relatively high refractive index, and $Al_{0.9}Ga_{0.1}As$, which has a relatively low refractive index, are alternately laminated. Each set of a high refractive index layer and a low refractive index is designated as one pair, and the lower DBR layers are basically constituted by 19.5 pairs.

<Simulation 1>

A light emitting diode (LED) having the configuration illustrated in FIG. 1 and of which specifics are shown in the table of FIG. 7 was considered. The reference numerals of FIG. 1 indicate which layers in the table of FIG. 7 correspond to which functional layer of the LED, and detailed descriptions thereof will be omitted (the same applies in cases that layer structures are shown in tables). The LED which was considered has a lower DBR layer 30, an n type doped layer (Al280) 13, a light emitting layer (active) 20, a p type doped layer (Al280) 15, a contact layer 17, and an antireflection layer (SiN) 18, which are provided on a GaAs substrate 10. The thickness of the light emitting layer 20 is $\lambda/2n_a$ (=108 nm) wherein $n_a$ is the refractive index of the light emitting layer. Note that in the table of FIG. 7, the $Al_xGa_{1-x}As$ layers are indicated by Al then the numerical value of x multiplied by 1000 (the same applies in the descriptions to follow). For example, Al900 represents an $Al_{0.9}Ga_{0.1}As$ low refractive index layer, and Al300 represents an $Al_{0.3}Ga_{0.7}As$ high refractive index layer.

As shown in the table of FIG. 7, numbers (No.) are sequentially assigned to the $Al_{0.9}Ga_{0.1}As$ low refractive index layers 31 within the lower DBR layer 30 starting from the side closest to the active layer. The average light emitting magnification and the fluctuations in temperature properties for cases in which the thickness of each one of the $Al_{0.9}Ga_{0.1}As$ low refractive index layers 31 was changed to a thickness having an optical length of $\lambda/2n$ (=0.124 μm) were obtained by simulations. The low refractive index layer 31 closest to the light emitting layer 20 is No. 1, and the low refractive index layer 31 closest to the substrate is No. 20. Note that the element structure which is used as the reference for the light emitting magnification does not have the lower DDR layer 30 shown in the table, and is of a configuration in which only the $Al_{0.9}Ga_{0.1}As$ layers are provided. The results of the simulations are shown in Table 1.

TABLE 1

| | No. | | | | | | |
|---|---|---|---|---|---|---|---|
| | 1 | 2 | 3 | 4 | 5 | 6 | 7 |
| Position | 0.05 | 0.1 | 0.15 | 0.2 | 0.25 | 0.3 | 0.35 |
| Average Light Emitting Magnification (x) | 1.6297 | 1.6313 | 1.6314 | 1.6271 | 1.6176 | 1.6032 | 1.5854 |
| Temperature Property Fluctuation (%/° C.) | 0.511 | 0.519 | 0.508 | 0.482 | 0.443 | 0.431 | 0.451 |

| | No. | | | | | | |
|---|---|---|---|---|---|---|---|
| | 8 | 9 | 10 | 11 | 12 | 13 | 14 |
| Position | 0.4 | 0.45 | 0.5 | 0.55 | 0.6 | 0.65 | 0.7 |
| Average Light Emitting Magnification (x) | 1.567 | 1.5513 | 1.5417 | 1.5404 | 1.5471 | 1.5595 | 1.5737 |

TABLE 1-continued

| Temperature Property Fluctuation (%/° C.) | 0.463 | 0.468 | 0.463 | 0.45 | 0.432 | 0.413 | 0.399 |

| | No. | | | | | |
|---|---|---|---|---|---|---|
| | 15 | 16 | 17 | 18 | 19 | 20 |
| Position | 0.75 | 0.8 | 0.85 | 0.9 | 0.95 | 1 |
| Average Light Emitting Magnification (x) | 1.5865 | 1.5958 | 1.6003 | 1.6004 | 1.5988 | 1.5993 |
| Temperature Property Fluctuation (%/° C.) | 0.393 | 0.396 | 0.426 | 0.499 | 0.568 | 0.621 |

Figure 8:
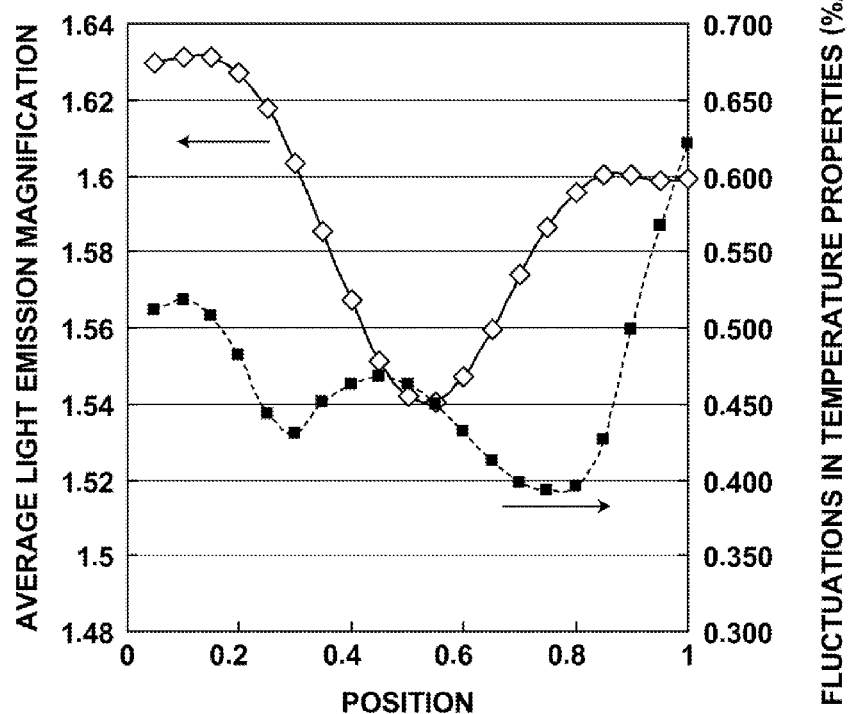
FIG. 8 is a graph that illustrates changes in average light emitting magnification and temperature property fluctuations according to the insertion positions of a λ/2n layer.

The results of Table 1 are illustrated in the graph of FIG. 8. Here, the insertion positions within the DBR layer are indicated as the percentage of the position of the surface of the layer which is converted to the thickness of $\lambda/2n$ toward the substrate when the surface of the DBR layer most toward the light emitting layer is designated as 0, and the interface thereof with the substrate is designated as 1.

It can be understood that fluctuations in temperature properties greatly vary according to the insertion position of the $\lambda/2n$ layer. In the case that only one $\lambda/2n$ layer is provided, the temperature property fluctuation becomes 0.45%/° C. or less within the ranges from 0.24 to 0.35 and from 0.55 to 0.87.

<Simulation 2>

Next, a case in which the thickness of the No. 1 $Al_{0.9}Ga_{0.1}As$ low refractive index layer 31 closest to the light emitting layer 20 is $\lambda/2n$ (=0.124 µm), and further the thickness of one of the No. 2 through No. 20 layers is $\lambda/2n$ (=0.124 µm) to be a second phase changing layer within the lower DBR layer 30 of the LED having the layer structure illustrated in FIG. 7 was analyzed by multiple layer film internal light emission simulations. Note that by providing the No. 1 layer as the first phase changing layer, it is expected that the phase changing layer will have the function of favorably adjusting the phase of light reflected toward the light emitting layer.

Figure 9:
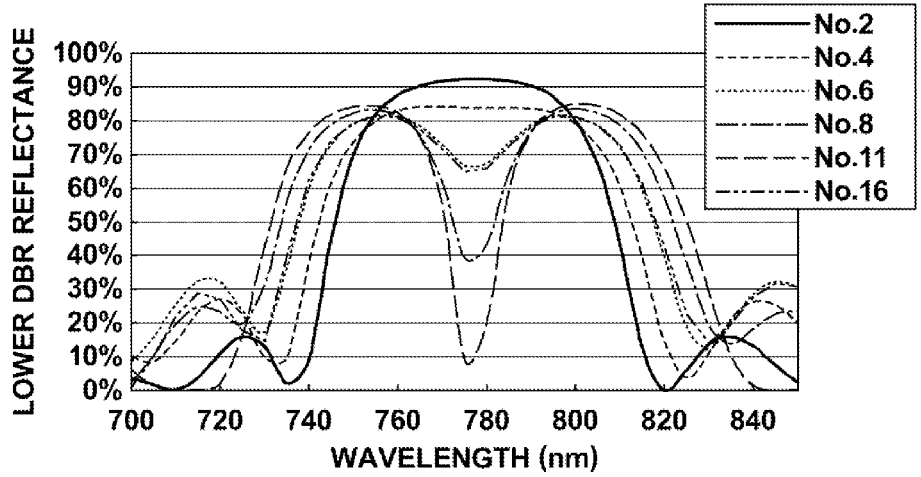
FIG. 9 is a graph that illustrates the DBR reflective spectrum for different insertion positions of a phase changing layer.

The lower DBR reflective spectrum in the case that the No. 2, 4, 6, 8, 11, or 16 layer is the second phase changing layer within the lower DBR layer is illustrated in FIG. 9.

In addition, the reflectances of the DBR with respect to the DBR reflective design central wavelength (775 nm) for cases in which each of the No. 2 through 20 layers within the lower DBR layer is the second phase changing layer are shown in Table 2.

TABLE 2

| | No. | | | | | | |
|---|---|---|---|---|---|---|---|
| | 2 | 3 | 4 | 5 | 6 | 7 | 8 |
| Position | 0.1 | 0.15 | 0.2 | 0.25 | 0.3 | 0.35 | 0.4 |
| Central Wavelength Reflectance (%) | 92.3 | 88.9 | 83.9 | 76.6 | 66.7 | 53.9 | 39.1 |

| | No. | | | | | |
|---|---|---|---|---|---|---|
| | 9 | 10 | 11 | 12 | 13 | 14 |
| Position | 0.45 | 0.5 | 0.55 | 0.6 | 0.65 | 0.7 |
| Central Wavelength Reflectance (%) | 24.5 | 13.3 | 8.8 | 12.2 | 22.5 | 36.8 |

| | No. | | | | | |
|---|---|---|---|---|---|---|
| | 15 | 16 | 17 | 18 | 19 | 20 |
| Position | 0.75 | 0.8 | 0.85 | 0.9 | 0.95 | 1 |
| Central Wavelength Reflectance (%) | 51.7 | 64.9 | 75.3 | 82.9 | 88.3 | 91.9 |

As illustrated in FIG. 9, the reflectance particularly of the central wavelength (design central wavelength) becomes low depending on the insertion position of the phase changing layer, while at the same time, the reflective bandwidth becomes wider. In addition, the spectrum shape becomes substantially the same at insertion positions symmetrical to the central position of the DBR (between layer No. 10 and layer No. 11 in the present example; No. 6 and No. 16 of FIG. 9, for example, show spectra which are substantially the same).

By inserting the second phase changing layer in the lower DBR layer, the phase of reflected waves reflected by a DBR layer above the second phase changing layer and the phase of reflected waves reflected by a DBR layer under the second phase changing layer will be in a relationship in which they cancel each other out. By setting the number of DBR layers above and below the phase changing layer to be the same, reflected waves of the DBR design wavelength will be substantially completely canceled out, and reflected waves will not be generated. In the case that the second phase changing layer is inserted at positions other than the central position, it is considered that reflection at the design wavelength will decrease due to a similar phenomenon. Meanwhile, with respect to wavelengths shifted from the DBR design wavelength, reflected waves of these wavelengths are originally in a relationship in which they cancel each other out. However, the relationship in which the reflected waves cancel each other out becomes weaker due to the phase changing layer being inserted, and these wavelengths will be reflected to a certain degree. It is considered that the phase changing layer which is inserted into the lower DBR layer contributes to widening of the reflective spectrum bandwidth in this manner.

Next, the average light emitting magnifications and fluctuations in temperature properties for cases in which the thickness of the No. 1 $Al_{0.9}Ga_{0.1}As$ low refractive index layer closest to the light emitting layer is $\lambda/2n$ (=0.124 μm), and further, the thickness of each of the No. 2 through 20 layers within the lower DBR layer is $\lambda/2n$ (=0.124 μm) were obtained. The results are shown in Table 3.

interface with the light emitting layer. Here, it became clear that fluctuations in temperature properties could be decreased to 0.2%/° C. or less if the second phase changing layer was provided within a range from 0.24 to 0.46 or a range from 0.66 to 0.82, when the DBR is divided into percentages, with the side thereof toward the light emitting layer designated as 0, and the side thereof toward the substrate designated as 1. In addition, it was understood that by providing the second phase changing layer within a range from 0.27 to 0.39 enabled the fluctuations in temperature properties to be decreased to 0.1%/° C. or less, which is particularly preferable.

<Simulation 3>

Next, the average light emitting magnifications and fluctuations in temperature properties were obtained for cases in which the thicknesses of the No. 1 and the No. 7 $Al_{0.9}Ga_{0.1}As$ low refractive index layer 31 are varied from 4 nm to 292 nm

TABLE 3

| | No. | | | | | | |
|---|---|---|---|---|---|---|---|
| | 2 | 3 | 4 | 5 | 6 | 7 | 8 |
| Position | 0.1 | 0.15 | 0.2 | 0.25 | 0.3 | 0.35 | 0.4 |
| Average Light Emitting Magnification (x) | 1.591 | 1.593 | 1.601 | 1.608 | 1.609 | 1.603 | 1.59 |
| Temperature Property Fluctuation (%/° C.) | 0.543 | 0.428 | 0.299 | 0.18 | 0.076 | 0.039 | 0.114 |

| | No. | | | | | |
|---|---|---|---|---|---|---|
| | 9 | 10 | 11 | 12 | 13 | 14 |
| Position | 0.45 | 0.5 | 0.55 | 0.6 | 0.65 | 0.7 |
| Average Light Emitting Magnification (x) | 1.574 | 1.561 | 1.554 | 1.557 | 1.569 | 1.585 |
| Temperature Property Fluctuation (%/° C.) | 0.19 | 0.244 | 0.267 | 0.256 | 0.213 | 0.167 |

| | No. | | | | | |
|---|---|---|---|---|---|---|
| | 15 | 16 | 17 | 18 | 19 | 20 |
| Position | 0.75 | 0.8 | 0.85 | 0.9 | 0.95 | 1 |
| Average Light Emitting Magnification (x) | 1.602 | 1.615 | 1.624 | 1.626 | 1.625 | 1.625 |
| Temperature Property Fluctuation (%/° C.) | 0.153 | 0.172 | 0.257 | 0.341 | 0.418 | 0.481 |

Figure 10:
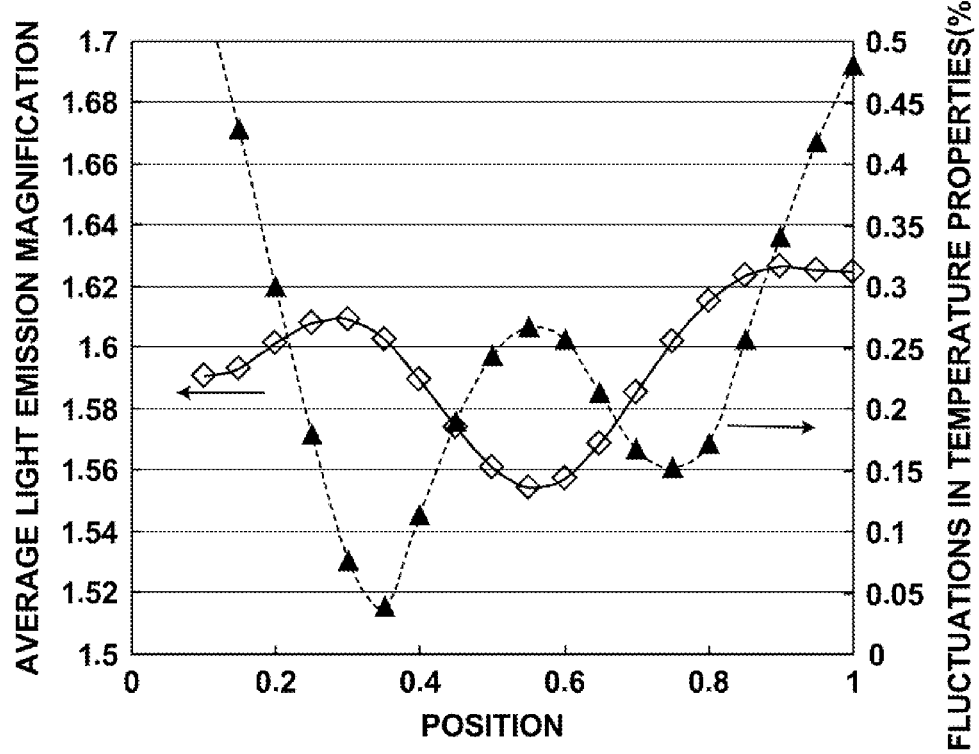
FIG. 10 is a graph that illustrates changes in average light emitting magnification and temperature property fluctuations according to the insertion positions of a second phase changing layer.

FIG. 10 illustrates the values of Table 3 as a graph.

Figure 11:
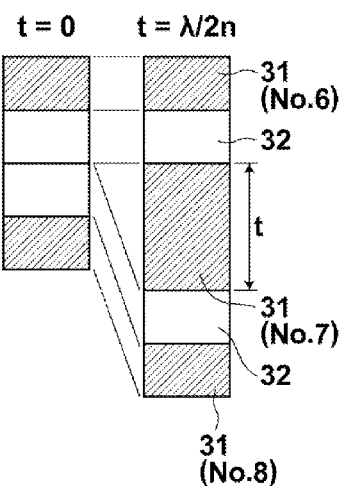
FIG. 11 is a diagram that illustrates the layer structure of an LED according to Simulation 3.

As described previously, differences did not appear when investigating only the reflectance of the lower DBR layer symmetrically above and below the center of the DBR. However, if light emission as a whole was considered, differences appeared when a resonator was formed with reflection at the in 12 nm increments of an LED having the layer structure illustrated in FIG. 11. FIG. 11 illustrates schematic sectional diagrams of the layer structures of layers No. 6 through No. 8 for cases in which the thickness of the No. 7 layer is t=0 and cases in which the thickness of the No. 7 layer is t=$\lambda/2n$. The results are shown in Table 4.

TABLE 4

| | No. | | | | | | |
|---|---|---|---|---|---|---|---|
| | 4 | 16 | 28 | 40 | 52 | 64 | 76 |
| Inserted Thickness (nm) | 1.5618 | 1.5438 | 1.5392 | 1.551 | 1.5779 | 1.6111 | 1.6387 |
| Temperature Property Fluctuation (%/° C.) | 0.069 | 0.25 | 0.42 | 0.522 | 0.599 | 0.649 | 0.644 |

| | No. | | | | | |
|---|---|---|---|---|---|---|
| | 88 | 100 | 112 | 124 | 136 | 148 |
| Inserted Thickness (nm) | 1.6509 | 1.6455 | 1.6279 | 1.6026 | 1.5745 | 1.5524 |
| Temperature Property Fluctuation (%/° C.) | 0.568 | 0.381 | 0.159 | 0.039 | 0.144 | 0.311 |

| | No. | | | | | |
|---|---|---|---|---|---|---|
| | 160 | 172 | 184 | 196 | 208 | 220 |
| Inserted Thickness (nm) | 1.5439 | 1.5525 | 1.5756 | 1.6048 | 1.6292 | 1.6422 |
| Temperature Property Fluctuation (%/° C.) | 0.455 | 0.527 | 0.616 | 0.664 | 0.642 | 0.517 |

| | No. | | | | | |
|---|---|---|---|---|---|---|
| | 232 | 244 | 256 | 268 | 280 | 292 |
| Inserted Thickness (nm) | 1.6431 | 1.6319 | 1.6085 | 1.5795 | 1.5553 | 1.5452 |
| Temperature Property Fluctuation (%/° C.) | 0.304 | 0.153 | 0.071 | 0.216 | 0.355 | 0.477 |

Figures 12, 13:
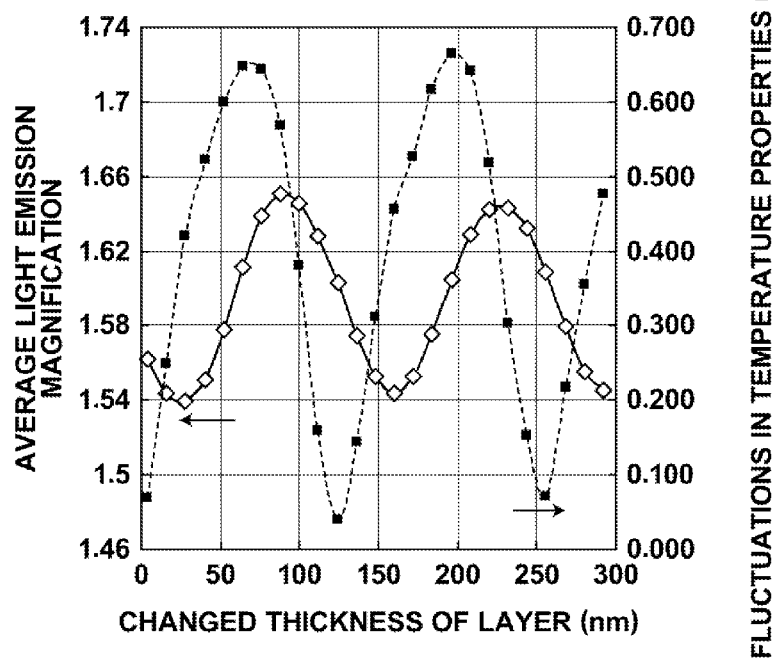
FIG. 12 is a graph that illustrates changes in average light emitting magnification and temperature property fluctuations according to layer thicknesses.
FIG. 13 is a diagram that illustrates the layer structure of an LED according to Simulation 4.

FIG. 12 shows the numerical values of Table 4 as a graph. As illustrated in FIG. 12, it was clear that the temperature property fluctuations and the light intensity magnifications change periodically according to changes in film thickness. It became clear that the temperature property fluctuations exhibited local minimum values when the optical film thickness substantially matched 0, $\lambda/2n$ (=124 nm), and $\lambda/n$. Because the changes are periodic, it can be considered that locally minimal values in temperature property fluctuations being exhibited at $t-m\lambda/2n$ can be generalized. When t is 0 (when m=0), the No. 7 layer does not exist as shown in the example of FIG. 11, and upper and lower high refractive index layers 32 will form a layer substantially $\lambda/2n$ thick. Therefore, it is considered that substantially the same advantageous effects will be obtained with respect to suppression of temperature property fluctuations. In the present example, it can be said that the thickness of the high refractive index layers 32 is approximately $\lambda/2n$ and constitutes a phase changing layer when m=0. Note that the light emitting magnification when the layer thicknesses t of layers No. 1 and No. 7 are 0 (when m=0) is less than that when t is $\lambda/2n$ (m=1) or $\lambda/n$ (m=2). It is considered that this is because m=0 is effectively equivalent to decreasing the number of layers within the DBR. Note that if m is two or greater, the advantageous effects obtained thereby are substantially the same. Taking the cost increase for the increase in film thickness into consideration, it is particularly favorable for the layer thickness t to be $\lambda/2n$ (m=1).

<Simulation 4>

A light emitting diode (LED) having the structure illustrated in FIG. 3 and having the layer structure which is shown in detail in the table of FIG. 13 as a layer structure above the light emitting layer 20 was considered. The layer structure of layers under the light emitting layer 20 is the same as that of the LED of Simulation 2. The reference numerals of FIG. 3 indicate which layers in the table of FIG. 13 correspond to which functional layer of the LED, and detailed descriptions thereof will be omitted. The average light emitting magnifications and temperature property fluctuations were obtained for cases in which the thickness of the No. 1 $Al_{0.9}Ga_{0.1}As$ layer 31 closest to the light emitting layer 20 is $\lambda/2n$ (=0.124 μm) and further the thickness of one of the No. 2 through No. 20 layers is changed to $\lambda/2n$ (=0.124 μm) to be a second phase changing layer, in the same manner as in Simulation 2. The results are shown in Table 5.

TABLE 5

| | No. | | | | | | |
|---|---|---|---|---|---|---|---|
| | 2 | 3 | 4 | 5 | 6 | 7 | 8 |
| Position | 0.1 | 0.15 | 0.2 | 0.25 | 0.3 | 0.35 | 0.4 |
| Average Light Emitting Magnification (x) | 1.6373 | 1.6345 | 1.6418 | 1.6501 | 1.6534 | 1.6499 | 1.6413 |
| Temperature Property Fluctuation (%/° C.) | 0.6541 | 0.4711 | 0.2661 | 0.1324 | 0.1146 | 0.2706 | 0.3982 |

| | No. | | | | | |
|---|---|---|---|---|---|---|
| | 9 | 10 | 11 | 12 | 13 | 14 |
| Position | 0.45 | 0.5 | 0.55 | 0.6 | 0.65 | 0.7 |
| Average Light | 1.6317 | 1.6258 | 1.6265 | 1.6343 | 1.6471 | 1.6614 |

TABLE 5-continued

| | | | | | | |
|---|---|---|---|---|---|---|
| Emitting Magnification (x) | | | | | | |
| Temperature Property Fluctuation (%/° C.) | 0.4928 | 0.5502 | 0.5692 | 0.5535 | 0.5106 | 0.4567 |

| | No. | | | | | |
|---|---|---|---|---|---|---|
| | 15 | 16 | 17 | 18 | 19 | 20 |
| Position | 0.75 | 0.8 | 0.85 | 0.9 | 0.95 | 1 |
| Average Light Emitting Magnification (x) | 1.6739 | 1.682 | 1.6855 | 1.6852 | 1.6834 | 1.684 |
| Temperature Property Fluctuation (%/° C.) | 0.4137 | 0.3666 | 0.3179 | 0.2979 | 0.3016 | 0.3044 |

Figure 14:
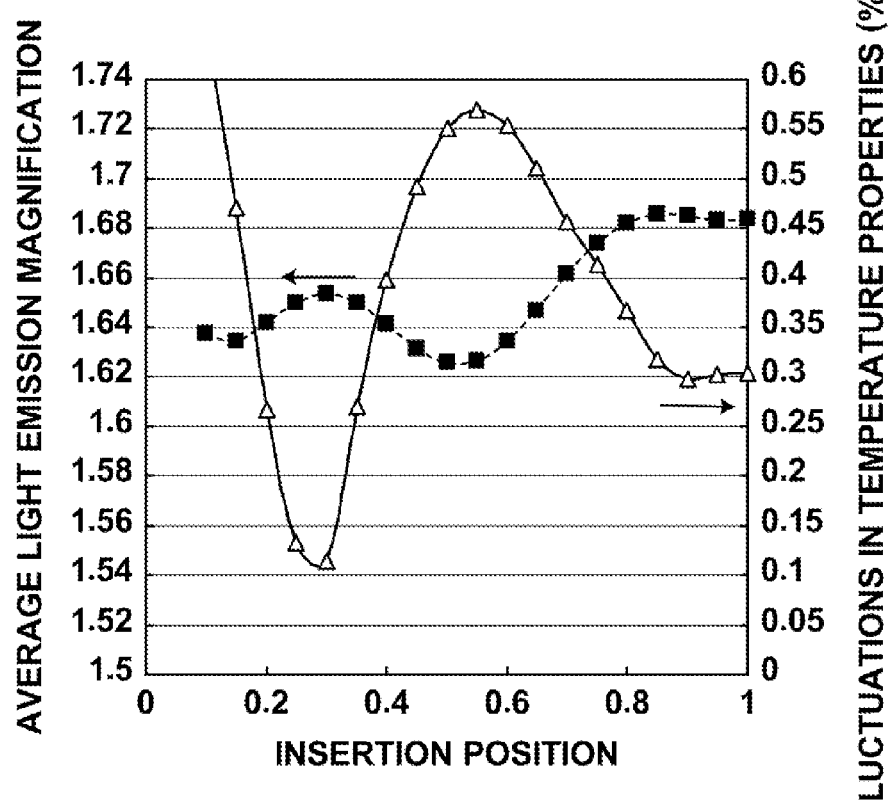
FIG. 14 is a graph that illustrates changes in average light emitting magnification and temperature property fluctuations according to the insertion positions of a second phase changing layer in an LED equipped with an upper DBR layer.

FIG. 14 illustrates the values of Table 5 as a graph.

It became clear from the present simulation that fluctuations in temperature properties could be decreased to 0.2%0° C. or less in an element structure provided with the upper DBR layer 35 by providing the second phase changing layer within a range from 0.22 to 0.33 when the DBR layer is divided into percentages, with the side thereof toward the light emitting layer designated as 0, and the side thereof toward the substrate designated as 1.

<Simulation 5>

Next, an LED having the layer structure shown in the table of FIG. 15 was considered. In Simulation 5, the structure of Simulation 3 illustrated in FIG. 11, in which the thicknesses of the No. 1 and No. 7 low refractive index layers within the lower DBR layer 30 are $\lambda/2n$ (=124 nm) and are phase changing layers, is employed as a base, and an $Al_{0.3}Ga_{0.7}As$ layer 34 is inserted in the No. 7 layer at the central position in the thickness direction thereof, was considered. As schematically shown in FIG. 15, the No. 7 layer is divided into two layers having a thickness of $\lambda/4n$ (=62 nm), and the $Al_{0.3}Ga_{0.7}As$ layer 34 is inserted therebetween. The average light emitting magnification and temperature property fluctuations were obtained for cases in which the thickness of the $Al_{0.3}Ga_{0.7}As$ layer 34 is varied from 5 nm to 80 nm in increments of 5 nm. The results are shown in Table 6.

TABLE 6

| | Inserted Thickness (nm) | | | | | |
|---|---|---|---|---|---|---|
| | 0 | 5 | 10 | 15 | 20 | 25 |
| Average Light Emitting Magnification (x) | 1.626 | 1.5982 | 1.5948 | 1.5913 | 1.5898 | 1.5893 |
| Temperature Property Fluctuation (%/° C.) | 0.039 | 0.076 | 0.127 | 0.203 | 0.262 | 0.301 |

| | Inserted Thickness (nm) | | | | |
|---|---|---|---|---|---|
| | 30 | 35 | 40 | 45 | 50 | 55 |
| Average Light Emitting Magnification (x) | 1.5909 | 1.5968 | 1.6034 | 1.613 | 1.6232 | 1.6316 |
| Temperature Property Fluctuation (%/° C.) | 0.346 | 0.383 | 0.425 | 0.476 | 0.506 | 0.519 |

| | Inserted Thickness (nm) | | | | |
|---|---|---|---|---|---|
| | 60 | 65 | 70 | 75 | 80 |
| Average Light Emitting Magnification (x) | 1.6376 | 1.6408 | 1.6416 | 1.6408 | 1.6389 |
| Temperature Property Fluctuation (%/° C.) | 0.518 | 0.507 | 0.488 | 0.459 | 0.417 |

Figure 16:
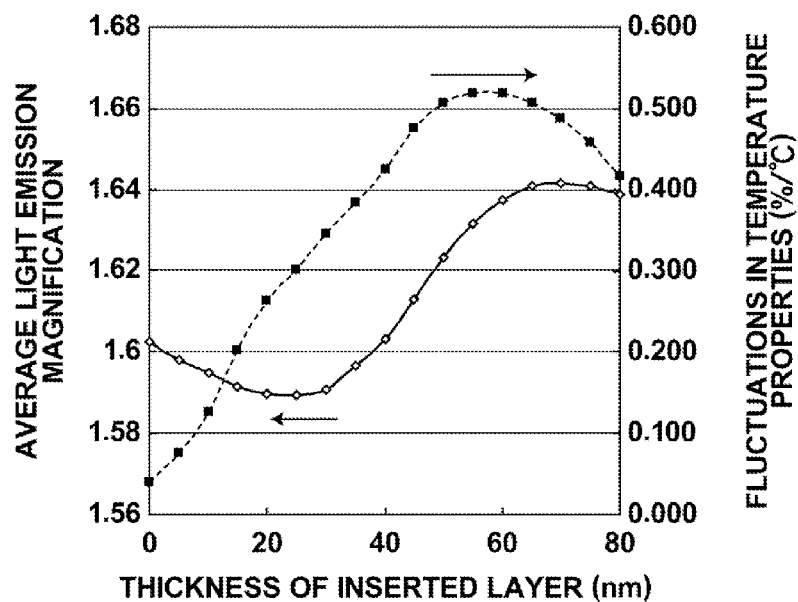
FIG. 16 is a graph that illustrates changes in average light emitting magnification and temperature property fluctuations according to layer thicknesses in the case that an intermediate layer is inserted within a phase changing layer.

The numerical values of Table 6 are illustrated in FIG. 16 as a graph.

Fluctuations in temperature properties increase as the layer thickness S of the inserted layer 34 becomes greater. The temperature property fluctuations become greatest in the vicinity of a thickness of 56 nm, which is substantially equal to the optical lengths of the layers above and below the layer 34. Meanwhile, it became clear that the temperature property fluctuations could be decreased to 0.2%/° C. or less if the layer thickness S is 15 nm or less. That is, even if an inserted layer is provided within the phase changing layer having a thickness of mλ/2n, both the light emission enhancing effect and the temperature property fluctuation suppressing effect can be sufficiently realized, if the thickness of the inserted layer is 15 nm or less.

The simulations described above were performed with respect to AlGaAs type semiconductor light emitting elements. However, it is considered that the temperature property fluctuation suppressing effect obtained by providing the phase changing layers within the lower DBR layer will be similarly exhibited regardless of the composition of the semiconductor light emitting element.

EXAMPLES

Hereinafter, Examples of the semiconductor light emitting element of the present invention and Comparative Examples will be described.

Average light intensity fluctuations and temperature property fluctuations were obtained for the Examples and Comparative Examples described below by the simulation technique described above.

Example 1

Figure 17:
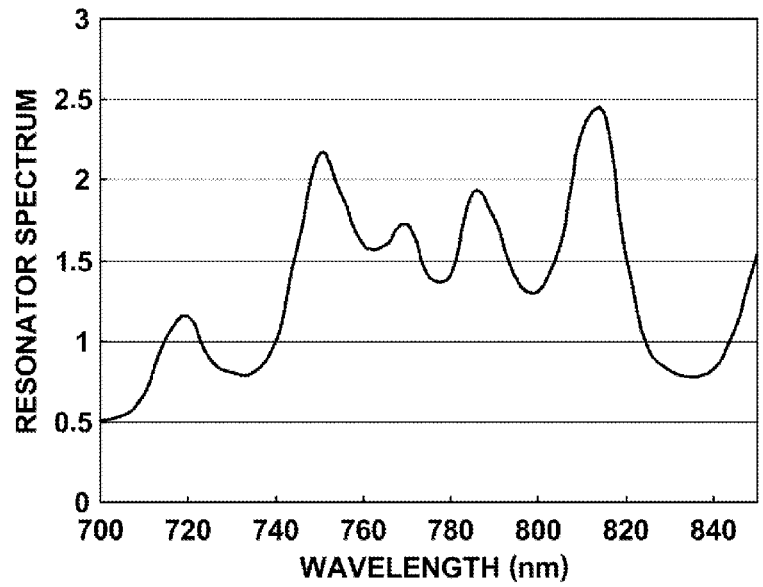
FIG. 17 is a graph that illustrates the resonator spectrum of an LED of Example 1.
Figure 18:
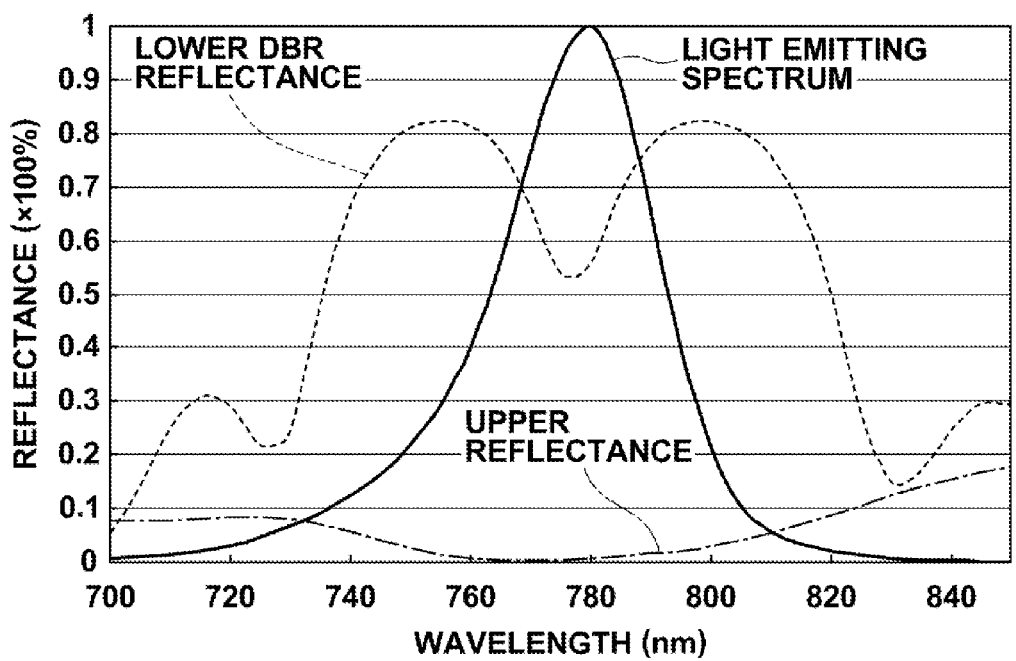
FIG. 18 is a graph that illustrates the natural light emitting spectrum, the reflective spectrum of a lower DBR layer, and a reflective spectrum of an upper AR layer of the LED of Example 1.

Example 1 is an LED having the layer structure of Simulation 2 illustrated in FIG. 11, in which the thicknesses t of the No. 1 and No. 7 low refractive index layers are λ/2n. The resonator spectrum of this element obtained by simulations is illustrated in FIG. 17. In addition, the natural light emitting spectrum, the reflectance of the lower DBR layer with respect to the peak light emission wavelength, and the reflectance of the upper AR layer with respect to the peak light emission wavelength are illustrated in FIG. 18.

Example 2

Figure 20:
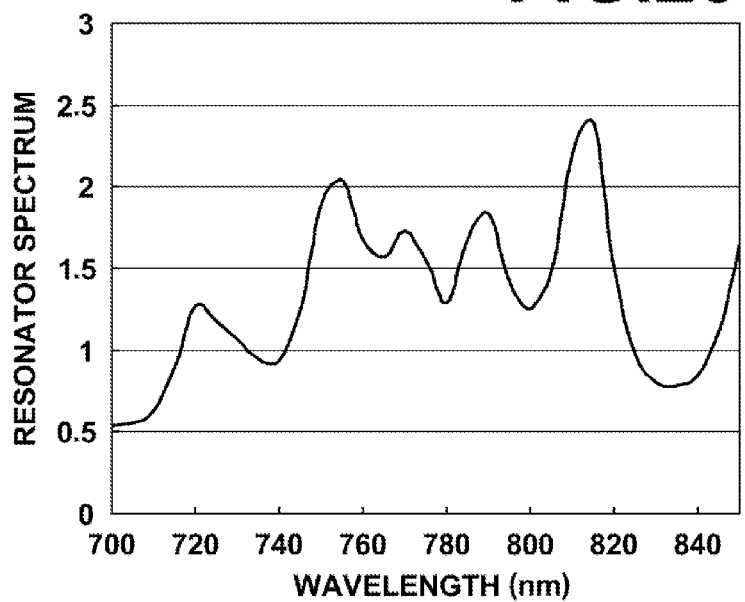
FIG. 20 is a graph that illustrates the resonator spectrum of an LED of Example 2.

Example 2 is an LED having the layer structure illustrated in FIG. 19. In the present element, the thicknesses of the high refractive index layers 32 under the No. 1 and No. 7 low refractive index layers within the lower DBR layer are changed to λ/2n (=116 nm) to become phase changing layers. The resonator spectrum of the present element obtained by simulations is illustrated in FIG. 20.

Example 3

Example 3 is an LED having the layer structure of Simulation 5 illustrated in FIG. 15, in which the thickness of the layer 34 inserted into the No. 7 low refractive index layer is 10 nm.

Comparative Example 1

Figure 21:
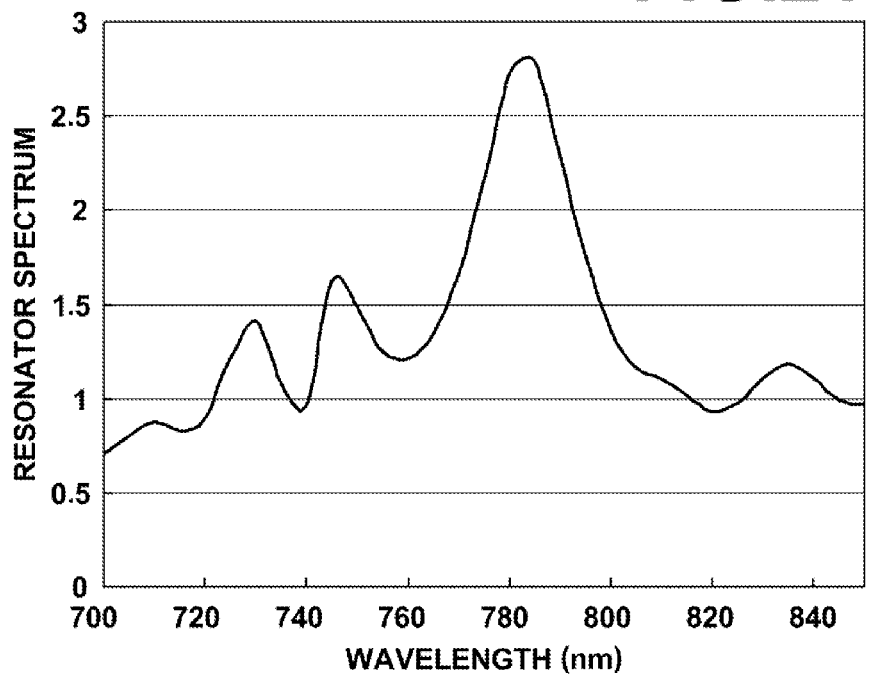
FIG. 21 is a graph that illustrates the resonator spectrum of an LED of Comparative Example 1.

Comparative Example 1 is an LED having the layer structure of the light emitting layer 20 and the layers under the light emitting layer 20 shown in the table of FIG. 7, and the upper DBR layer 35 illustrated in FIG. 13 as a layer above the light emitting layer 20. That is, the present element is provided with the lower DBR layer 30 constituted by 19.5 pairs, and the upper DBR layer 35 constituted by 5 pairs, without a phase changing layer having a thickness of mλ/2n. The resonator spectrum of the present element obtained by simulations is illustrated in FIG. 21.

Comparative Example 2

Comparative Example 2 has the layer structure shown in the table of FIG. 7. That is, the present element is provided with a lower DBR layer constituted by 19.5 pairs, an AR structure as a layer above the light emitting layer instead of a DBR layer, without a phase changing layer having a thickness of mλ/2n. The resonator spectrum of the present element obtained by simulations is illustrated in FIG. 22.

The results of obtaining the average light emitting magnifications and the fluctuations in temperature properties of Examples 1 through 3 as well as Comparative Examples 1 and 2 by the simulation technique described above are shown in Table 7.

TABLE 7

|  | Average Light Emitting Magnification M (x) | Fluctuation δ of Temperature Properties (%/° C.) |
|---|---|---|
| Example 1 | 1.603 | 0.039 |
| Example 2 | 1.576 | 0.049 |
| Example 3 | 1.595 | 0.127 |
| Comparative Example 1 | 1.670 | 0.800 |
| Comparative Example 2 | 1.605 | 0.644 |

As shown in Table 7, the fluctuations in temperature properties of Example 1 is 1/20 those of a conventional element structure provided with DBR layers above and below a light emitting layer (Comparative Example 1), and exhibits an extremely high temperature property fluctuation suppressing effect. Both of Examples 1 and 2 can suppress temperature property fluctuations to 0.1%/° C. or less. This indicates that the layer having the thickness of λ/2n may be either a low refractive index layer or a high refractive index layer.

The semiconductor light emitting element of the present invention will exhibit extremely advantageous effects if applied to an LED array exposure device that employs a plurality of LED's produced on a single wafer and has fluctuations in film thicknesses, in which it is necessary to uniformize the light intensities of the plurality of LED's.

What is claimed is:

1. A semiconductor light emitting element that outputs emitted light having a predetermined emitted light peak wavelength A, comprising at least:
    a substrate;
    a lower distributed Bragg reflector layer provided on the substrate; and
    a light emitting layer provided on the lower distributed Bragg reflector layer;
    at least one phase changing layer having a thickness of mλ/2n (wherein n is the refractive index of the phase changing layer, and m is an integer 1 or greater) being provided within the lower distributed Bragg reflector layer;
    a distributed Bragg reflector layer is not provided as a layer above the light emitting layer; and an antireflection layer is provided as a layer above the light emitting layer;

the lower distributed Bragg reflector layer being equipped with a first distributed Bragg reflector layer and a second distributed Bragg reflector layer;

the at least one phase changing layer is provided between the first distributed Bragg reflector layer and the second distributed Bragg reflector layer; and the antireflection layer being formed by a material having a refractive index lower than the refractive index of the light emitting layer.

2. A semiconductor light emitting element as defined in claim 1, wherein:

two phase changing layers are provided within the lower distributed Bragg reflector layer.

3. A semiconductor light emitting element as defined in claim 1, wherein:

the lower distributed Bragg reflector layer is basically constituted by two or more pairs of a low refractive index layer having a thickness a and a high refractive index layer having a thickness b which are alternately laminated; and one of the low refractive index layers and the high refractive index layers constituting the phase changing layer having the thickness $m\lambda/2n$, which is different from the thickness a and the thickness b.

4. A semiconductor light emitting element as defined in claim 1, wherein:

two of the phase changing layers are provided within the lower distributed Bragg reflector layer;

one of the two phase changing layers is one of the low refractive index layer and the high refractive index layer that constitutes the pair most toward the side of the light emitting layer; and the other of the two phase changing layers the one phase changing layer provided between the first distributed Bragg reflector layer and the second distributed Bragg reflector, and is present within one of a range from 0.24 to 0.46 and a range from 0.66 to 0.82, when the lower distributed Bragg reflector layer is divided into percentages, with the side thereof toward the light emitting layer designated as 0, and the side thereof toward the substrate designated as 1.

5. A semiconductor light emitting element as defined in claim 4, wherein the other of the two phase changing layers is present within a range from 0.27 to 0.39 within the lower distributed Bragg reflector layer.

6. A semiconductor light emitting element as defined in claim 1, which is a light emitting diode of the surface emitting type.

7. A semiconductor light emitting element that outputs emitted light having a predetermined emitted light peak wavelength $\lambda$, comprising at least:

a substrate;

a lower distributed Bragg reflector layer provided on the substrate; and a light emitting layer provided on the lower distributed Bragg reflector layer;

an upper distributed Bragg reflector layer being provided as a layer above the light emitting layer;

two phase changing layers having a thickness of $m\lambda/2n$ (wherein n is the refractive index of the phase changing layer, and m is an integer 1 or greater) being provided within the lower distributed Bragg reflector layer;

one of the two phase changing layers is a low refractive index layer and a high refractive index layer that constitutes a pair most toward the side of the light emitting layer; and the other of the two phase changing layers is present within one of a range from 0.22 to 0.33, when the lower distributed Bragg reflector layer is divided into percentages, with the side thereof toward the light emitting layer designated as 0, and the side thereof toward the substrate designated as 1.

8. A semiconductor light emitting element as defined in claim 7, wherein:

two phase changing layers are provided within the lower distributed Bragg reflector layer.

9. A semiconductor light emitting element as defined in claim 7, wherein:

the lower distributed Bragg reflector layer is basically constituted by two or more pairs of a low refractive index layer having a thickness a and a high refractive index layer having a thickness b which are alternately laminated; and one of the low refractive index layers and the high refractive index layers constituting the phase changing layer having the thickness $m\lambda/2n$, which is different from the thickness a and the thickness b.

10. A semiconductor light emitting element as defined in claim 7, which is a light emitting diode of the surface emitting type.

* * * * *